United States Patent [19]
Quirk

[11] Patent Number: 5,240,738
[45] Date of Patent: Aug. 31, 1993

[54] METHOD OF APPLYING SOLDER TO A FLEXIBLE CIRCUIT

[75] Inventor: Michael G. Quirk, Austin, Tex.

[73] Assignee: International Business Machines Corporation, Armonk, N.Y.

[21] Appl. No.: 815,467

[22] Filed: Dec. 31, 1991

[51] Int. Cl.⁵ .............................................. C23C 26/00
[52] U.S. Cl. ...................................... 427/96; 427/348; 427/433; 427/349
[58] Field of Search ................. 427/96, 433, 348, 349; 118/423, 404, 62, 63

[56] References Cited
U.S. PATENT DOCUMENTS

| | | | |
|---|---|---|---|
| 3,930,075 | 12/1975 | Myers | 427/433 |
| 3,932,683 | 1/1976 | Robins | 427/433 |
| 4,277,518 | 7/1981 | Schillke | 427/433 |
| 4,469,716 | 9/1984 | Caratsch | 427/96 |
| 4,608,941 | 9/1986 | Morris | 427/96 |
| 5,015,509 | 5/1991 | Rey | 427/433 |
| 5,074,242 | 12/1991 | Bricmont | 427/348 |

*Primary Examiner*—Shrive Beck
*Assistant Examiner*—Vi Duong Dang
*Attorney, Agent, or Firm*—Andrea P. Bryant; Jeffrey S. LaBaw

[57] ABSTRACT

A flexible circuit 10 panel is coated with solder by lowering into a bath of molten solder 4. On removal from the bath excess solder is blown from the panel by air jets from one or more nozzles 22. The panel is pulled towards the nozzle by a region 60 of negative pressure associated with the nozzles, and is held close to the nozzles to obtain an even coating of solder.

5 Claims, 4 Drawing Sheets

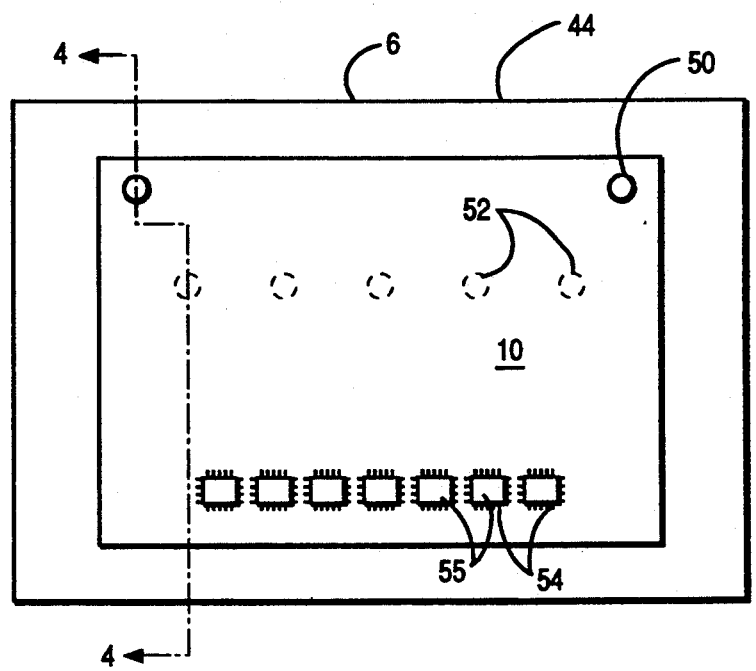
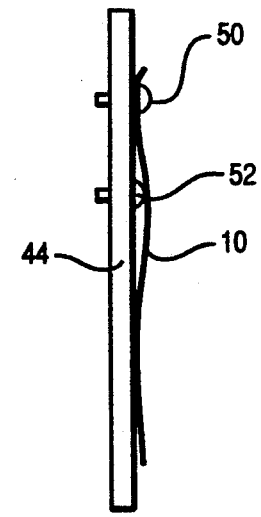
FIG. 3  FIG. 4
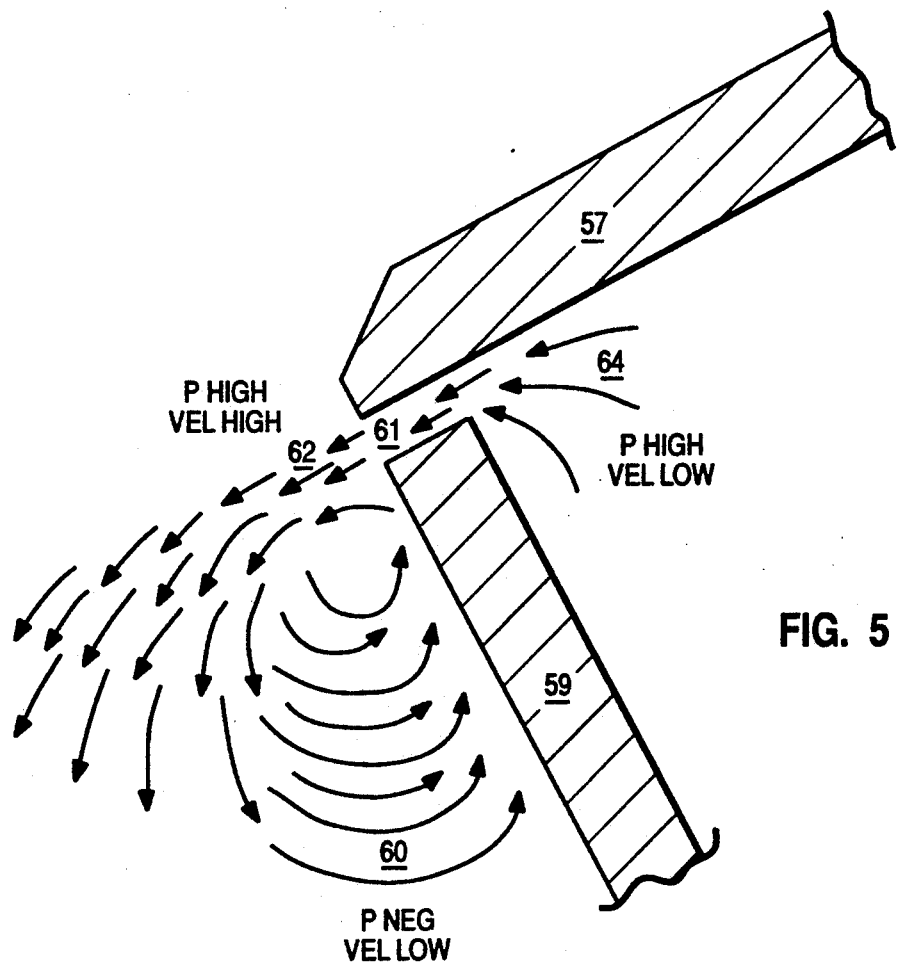
FIG. 5

STAGE 1

STAGE 2

STAGE 3

METHOD OF APPLYING SOLDER TO A FLEXIBLE CIRCUIT

BACKGROUND OF THE INVENTION

1. Field of the Invention

This invention relates to a method for applying solder to flexible circuits based on a hot air solder levelling approach. More specifically, it relates to using a negative pressure region at the hot air nozzle exit to reduce the distance between the panel and the hot air nozzle for obtaining interaction of the panel with air current patterns.

2. Description of Related Art

In a standard manufacturing process for printed circuit boards (PCBs), copper conductive tracks on the PCB are protected from oxidation by coating them with a thin layer of solder. The tracks are first cleaned in a flux solution which comprises a mixture of acid cleaner and solder solvent, and then dipped into a bath of molten solder. On withdrawal from the bath, solder adheres to the exposed copper tracks (but not to other regions of the PCB). To ensure that an even coating of solder has been applied, a hot air solder levelling (HASL) machine, such as that described in GB 1457325, can be used. In a HASL machine, as the PCB is lifted out of the solder bath, it is blasted by jets of hot air from nearby nozzles which blow away excess solder.

After the HASL stage, electronic components such as silicon chips are mounted onto the PCB. Typically, a set of pads is arranged around the periphery of a component site, each pad being the termination of a conductive copper track that provides an input/output line to the component. The components usually have a set of leads for soldering to the pads, or occasionally terminals on the component can be directly bonded onto the pads (such as with direct chip attachment). In either approach, additional solder is applied to the pads after the HASL process, typically by screening. This solder is used for bonding the components to the pads. As the size of the electronic components for such circuits has shrunk, so has the spacing of the pads surrounding them. In some cases adjacent pads are no more than 0.2 mm apart, approximately equal to the width of the pads themselves. Solder screening techniques are not at present capable of depositing such finely-spaced quantities of solder.

In order to produce flex circuits with a very fine pad spacing, an attempt was made to use the HASL process not only to prevent oxidation of the copper tracks, but also to provide sufficient solder on the pads to allow the components to be attached without a further solder apply stage. This places constraints on the thickness of the HASL solder coating, because too much solder will result in shorts between adjacent pads, while too little will not provide a good bond. The specifications for the particular flex circuit in question were a solder pad height of between 10 and 70 μm (microns) (height is used as an accessible measure of the volume of applied solder). However, a significant proportion of the panels required rework (because it is much easier to remove excess solder at rework than to add some more, the process was deliberately set to ensure that most out-of-spec pads had too much solder). The high degree of rework required costs both time and money.

SUMMARY OF THE INVENTION

The present invention is concerned with the use of HASL in the manufacture of flexible (flex) circuits, which are similar to conventional PCBs, but have a flexible substrate such as polymide. Copper tracks are etched onto the flexible substrate, and subsequently electronic components such as silicon chips are attached, as for a PCB. Typically several circuits are fabricated on a single flexible substrate panel, which is then cut to form the individual circuits.

The invention provides a method of applying solder to a flexible circuit panel, comprising the steps of: lowering the panel into a solder bath; lifting the panel out of the solder bath past at least one nozzle; directing a jet of hot air from the nozzle(s) towards the panel to remove excess solder from the panel, the nozzle(s) having a negative pressure region adjacent the jet; said method being characterized by supporting the panel with its lower end free, and ensuring that during the lifting step said lower end of the panel enters the negative pressure region which acts to draw the panel towards the nozzle(s).

By allowing the bottom of the panel to move freely, the negative pressure region is able to draw the panel close to the nozzle(s) and into the hot air jet region where the airflow is laminar. This results in a much more uniform solder height. This is further helped by the reduced nozzle velocity which is made possible by having a smaller distance between the panel and the nozzle(s) than in a conventional HASL machine. The method of the invention requires only some minor alterations to a standard HASL machine and these are relatively simple and cheap.

Preferably, the panel is supported by a carrier which includes fulcrum means, whereby the force of the jet of air on the panel pivots the panel about the fulcrum means, thereby causing the panel to enter the negative pressure region. The fulcrum means may comprise a plurality of horizontally disposed studs, a horizontal ridge, or any other suitable device.

BRIEF DESCRIPTION OF THE DRAWING

The above and other features and advantages of the instant invention will be described in connection with a preferred embodiment thereof having reference to the following drawing wherein like reference numerals are used throughout the various figures to denote the same elements and wherein:

FIG. 3 illustrates a flex panel carrier for use with the method of the present invention;

FIG. 4 is a cross sectional view of FIG. 3 taken along line 4—4;

FIG. 5 illustrates the pressure regions adjacent to nozzle exit;

DETAILED DESCRIPTION OF THE PREFERRED EMBODIMENT

Figure 1:
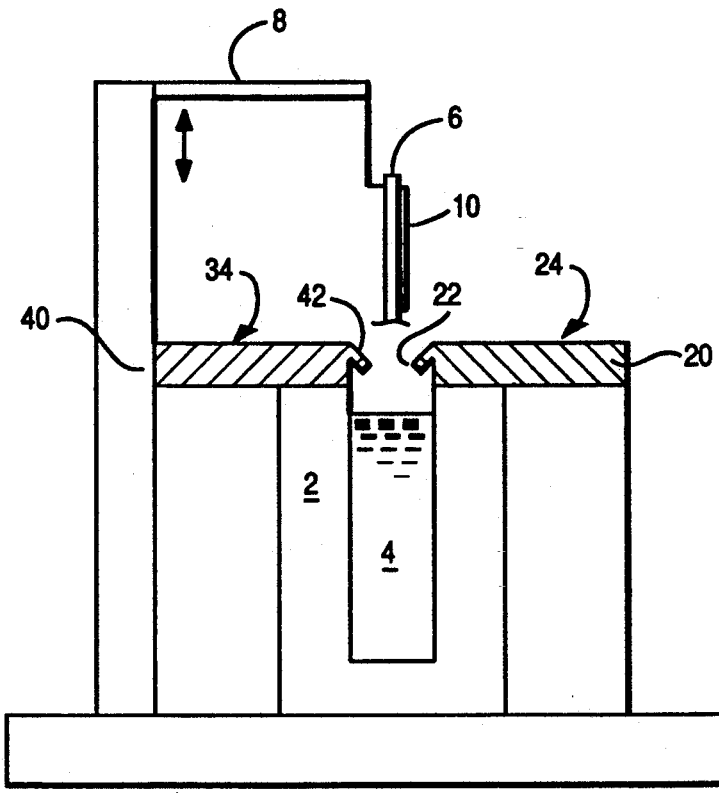
FIG. 1 is a schematic section through a conventional HASL machine.

A conventional HASL machine is shown in FIG. 1. Since such machines are well-known in the art, only an outline description is given. The machine has a bath 2 containing molten solder 4, which is typically a eutectic mixture of approximately 37% lead and 63% tin. The solder temperature is usually around 280 degrees Celsius, although this can be varied. Note that a panel to be coated with solder will not reach such a temperature if it is only briefly in the solder. Typically immersion times are in the order of two to three seconds. The thermal energy imparted to the panel can be controlled both by the temperature of the bath, and the duration of immersion.

Support fixture or carrier 6 is provided for supporting a flex panel to be immersed in solder bath 4. Carrier 6, is typically a G-10 laminate made from epoxy/fiberglass which material is similar to the substrates used with hard card printed circuit boards (PCBs). Support fixture 6 is suspended from an immersion arm 8, which can be lowered and raised so as to immerse fixture 6, on which flex panel 10 is mounted, in solder bath 4. Flex panel 10 is securely attached around its periphery to carrier 6.

Above solder bath 4 is a pair of air knives 24, 34, each having a heater for the input air 20, 40 and a row of nozzles 22, 42. The nozzles direct jets of air at the passing flex panel as it is lifted out of the solder bath to blow excess solder back into the bath. Carrier 6 may be provided with holes (not shown) for allowing air from nozzle 42 to reach the back of panel 10.

In general, the angle of the nozzles and the separation between the nozzles and the panel are important parameters in controlling the performance of the air jets. In the prior art apparatus shown, nozzle 22 is fixed at 30 degrees downward from the horizontal as indicated at angle 23. The purpose of the downward angle is partly to ensure that solder removed from the panel falls back into solder bath 4. In operation, there is a separation of about 3.5 mm between nozzle 22 and panel 10.

Figure 2:
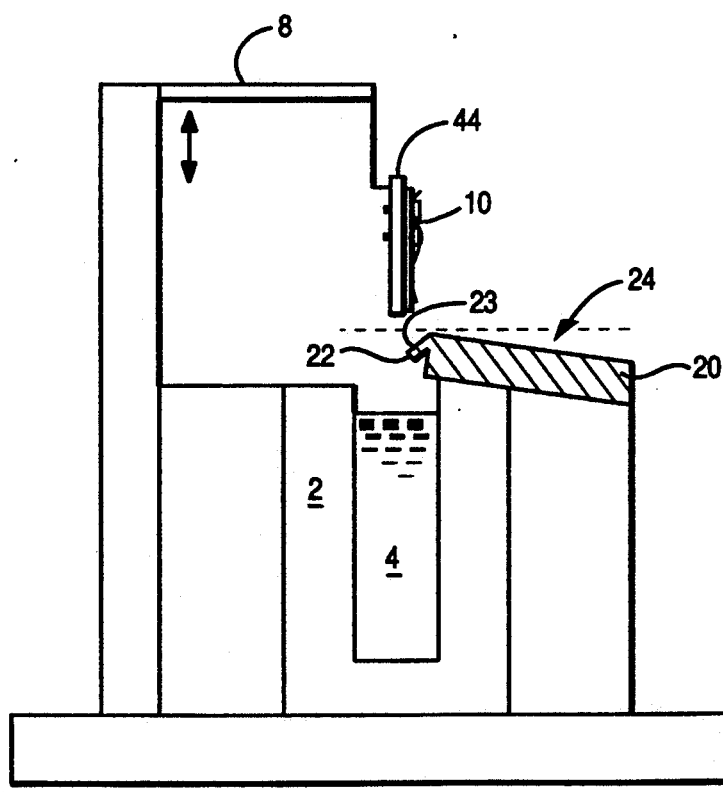
FIG. 2 illustrates the HASL machine of FIG. 1 adapted for use with the method of the present invention.

FIG. 2 illustrates the HASL machine of FIG. 1 modified in accordance with the present invention in order to overcome the problems described above. The alteration made is simple and relatively inexpensive. The main change is that the nozzle exit angle 23 has been decreased to about 25 degrees from the horizontal. The optimum arrangement must essentially be found by a trial and error approach.

In FIG. 2 only one air knife assembly 24 is shown for the sake of simplicity. Assembly 4 has been shifted in position to place the exit angle 23 from nozzle 22 at a smaller angle downward from the horizontal. Those having skill in the art will appreciate that this mechanical arrangement is used for illustration only and that other arrangements for mounting nozzles and heaters and connections therebetween may be made. The importance of the geometry of the panel and air jet will become clear as this description progresses.

FIG. 3 shows in simplified form a laminate carrier 44 for supporting a flexible panel 10 during use in accordance with the method of the invention. Panel 10 has rows of pads 54 shown somewhat schematically on its lower portion around intended component sites 55. Conductive tracks to the pads are not shown. Panel 10 is only fastened to carrier 44 along its top edge by two snap-in poppets 50, although tape or other fastening means could also be used so long as the bottom of panel 10 is free to flap. The advantage of poppets is that they are completely reusable.

There is a further set of projecting poppets 52 shown on the face of carrier 44 underneath panel 44, whose function is explained below in connection with FIG. 6. Projecting poppets 52 may be a continuous projection. The height of projections 52 above carrier 44 is preferably about 3 mm and the panel 10 thickness is 0.5 mm maximum. Whatever form projections 52 take, the rise is low enough to avoid any obstruction between the panel and the nozzle walls during panel insertion/withdrawal.

The HASL machine of FIG. 2 in conjunction with carrier fixture 44 and panel of FIG. 3 is basically operated in the same way as a conventional HASL machine, in that panel 10 is lowered into the molten solder bath 4 and subsequently withdrawn past a series of nozzles. However, the slight modifications to the angular orientation nozzle 22, the distance thereof from the face of carrier 44, and the method of attachment of panel 10 to carrier 44, result in quite different behavior when the air jets from nozzle 22 impinge on panel 10. It should be noted that nozzle 22 may be a single nozzle extending in length a distance as least as wide as carrier 44. Likewise, it may also comprise a plurality of closely spaced individual nozzles.

To understand what happens, refer now to FIG. 5 which is an enlarged, schematic diagram of the outlet area of nozzle 22 from FIG. 2. Considering the airflow regions around a nozzle, it can be seen that essentially three main airflow regions are formed: a high pressure low velocity region 64 in the nozzle cavity; a high pressure high velocity region 62 at the nozzle exit; and a negative pressure, with respect to the atmosphere pressure, low velocity region 60 adjacent the jet of air from the nozzle. The last of these three regions 60 is also referred to as a turbulent wake and exists essentially whatever the configuration of the nozzle. This turbulent wake usually forms some sort of ring around a jet of air exiting from the nozzle. The high pressure, high velocity region 62 has laminar flow near the nozzle, but breaks up into more turbulent flow further from the nozzle.

Figure 6A:
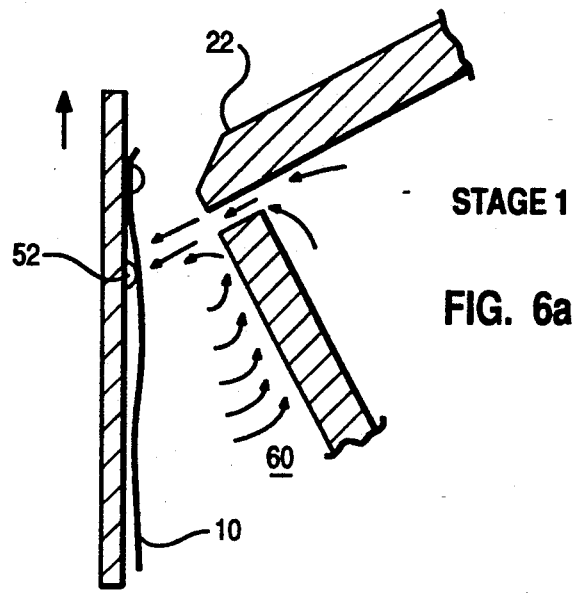
FIGS. 6a, 6b and 6c illustrate a flex panel as it is lifted out of the solder bath.
Figure 6B:
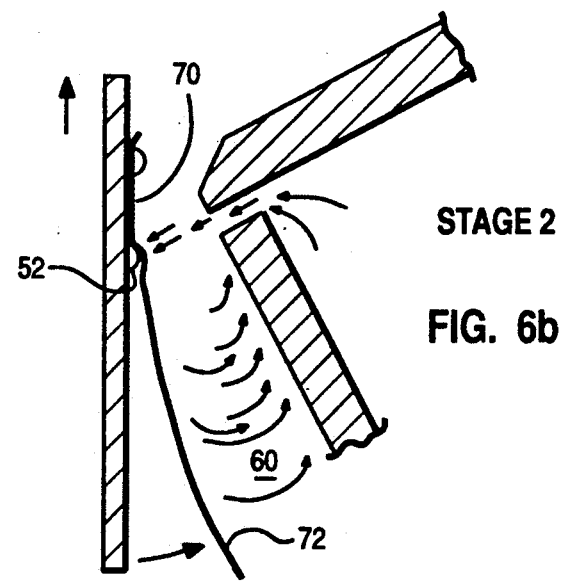
Figure 6C:
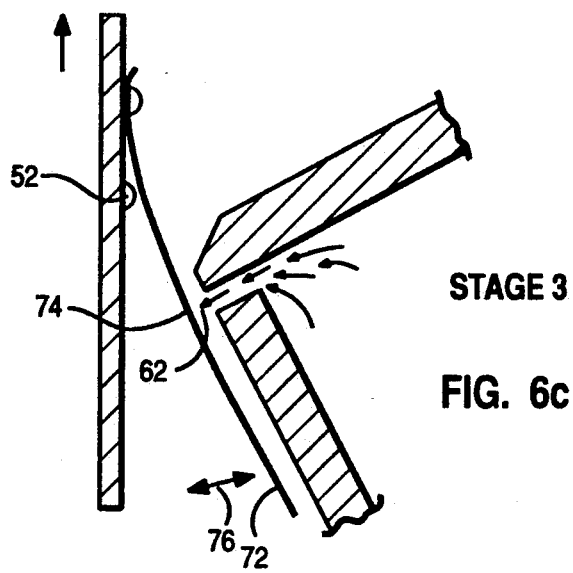

The behavior of panel 10 as it is raised out of solder bath 4 past nozzle 22 is shown in FIGS. 6a, 6b, and 6c. The force of the air jet on the upper section 70 of panel 10 above the row of projections 52 pushes that part of the flexible panel against the carrier 44. Projections 52 act as a fulcrum, so that the part 72 of panel 10 below the fulcrum is pivoted away from carrier 44 and into the negative pressure low velocity region 60 of the turbulent wake. The result is that an intermediate portion 74 of panel 10 is drawn up against nozzle 22, and held there. The portion 72 of panel 10 in the negative pressure region 60 then flaps backwards and forwards, i.e., away from and towards carrier fixture 44 as indicated by bidirectional arrow 76 about the point nearest nozzle 22. The flapping is due to panel 10 being repeatedly repulsed by air in high pressure region 62 by nozzle 22 and then pulled back toward nozzle 22 and into negative pressure region 60.

In operation, the withdrawal of panel 10 and carrier 44 from molten solder bath 4 past nozzle 22 is a continuous process step, but may also be described as including three stages. Referring now to FIG. 6a, Stage 1 commences at the completion of the period of panel 10 immersion in molten solder bath 4. Hot air knife assembly 24 is activated by passing compressed air therethrough. In this illustrative embodiment pressure is 8 psi, adjusted within about 0.5 psi plus or minus. Once heated, high pressure air flows through exit 62 of nozzle 22, withdrawal of panel 10 begins as arm 8 raises carrier 44.

Stage 2, shown in FIG. 6b occurs when high pressure air 62 from nozzle 22 strikes panel 10 first in the area 70 above projections 52 on carrier 44. This action causes lower section 72 of panel 10 to pivot into negative pressure region 60. It is at this stage that the nozzle exit angle 23 is important. By decreasing the nozzle exit angle 23 to 25 degrees from the horizontal, it has effectively rotated the negative pressure region 60 to be slightly closer to the lower section 72 of panel 10. This helps to ensure that the lower section 72 enters the nozzle negative pressure region 60 and that panel 10 is properly positioned to start stage 3.

Stage 3, FIG. 6c, commences once lower section 72 of panel 10 reaches negative pressure region 60. As upward motion of arm 8 continues, lower section 72 of panel 10 is entrained in negative pressure region 60, and copper pads 54 with molten solder adherent thereto pass through laminar flow region 62 of high pressure air flow nearest the exit area 61 of nozzle 22.

Figure 7:
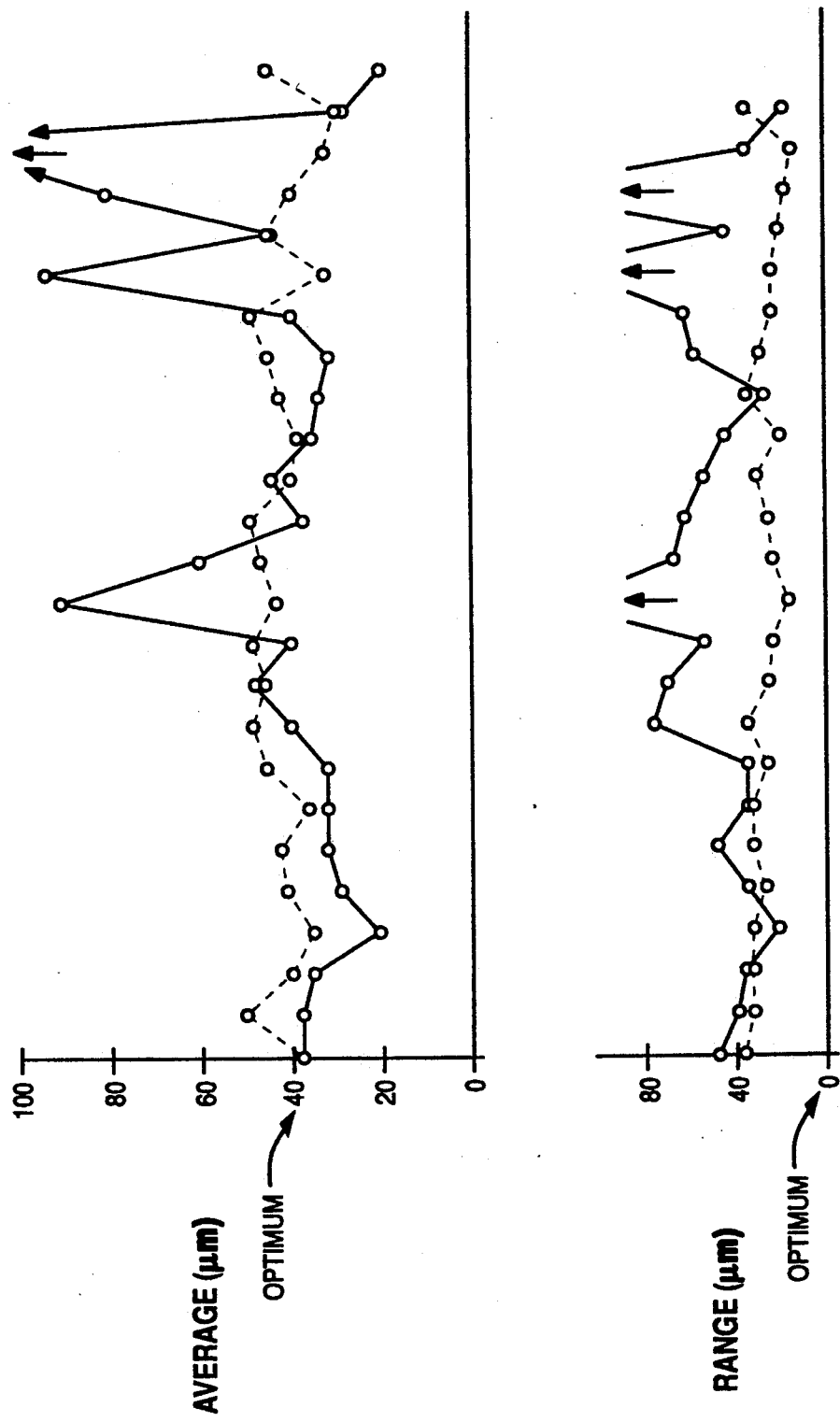
FIG. 7 illustrates graphically the improvement in solder height control obtained by the method of the invention.

The high pressure heated air stream is provided to remove excess solder from pads 54 on panel 10. Since region 60 of negative air pressure positions and holds panel 10 in laminar flow region 62, uniform amounts of solder are removed from all pads 54. The result is improved solder deposition heights, as illustrated in the charts of FIG. 7.

A second air knife at the rear, such as air knife 40. FIG. 1, directed at the rear of panel 10 would be of limited use with the modified HASL machine of FIG. 2, since panel 10 can only flap in one direction. Thus, solder is controllably applied to pads on only one side of the panel. In a modification to my preferred embodiment, a rear air knife may be used to blow solder out of panel through holes. Such holes were located relatively near the top of the panel, away from the pads to be coated with solder.

It has been found experimentally that the method of the invention gives much improved control on solder height. This is illustrated in FIG. 7, which shows results from a series of trials involving the measurement of solder pad height. The mean and range of solder height in microns for a sample of 8 pads for 25 different trials is shown firstly as solid lines for panels produced using the unmodified HASL apparatus of FIG. 1 and, secondly, as dashed lines for panels produced using the HASL apparatus of FIG. 2 in accordance with the method of the instant invention. The number of out-of-spec pads has been found to be reduced by a factor of over 100 by using the method of the invention. Since there may be over 300 pads per circuit, and just one bad pad means that the circuit must be rejected, this is an extremely valuable improvement.

The reason for the better control of solder height is believed to be that the negative pressure region holds the panel adjacent the nozzle, and solder is removed in the laminar flow region 62 (FIG. 5). rather than in a turbulent region further away. This results in a much more uniform set of solder heights. Furthermore, because panel 10 is closer to nozzle 22, the flow velocity through the nozzle can be reduced, which also provides better control of solder height. Nozzle velocity is a parameter which must be optimized experimentally. If the nozzle velocity is too high the panel will be blown out of the negative pressure region, while too low a velocity and the negative pressure region will be too weak to lift the panel.

It should be realized, therefore, that the flapping of flex panel 10, per se, does not produce the improvement in solder height control. Rather, it indicates that panel 10 has entered the negative pressure region and so will be held close to the nozzle. It is the use of the negative pressure region to draw the flex panel close to the nozzle that provides the advantages of the method of the invention. The flapping is due to the end of the panel being free, which is necessary in order to allow the panel to be bent into the negative pressure region and be held close to the nozzle.

While the invention has been described having reference to a particular, preferred embodiment, those having skill in the art will understand that the above noted and various other modifications in form and detail may be made without departing from the spirit of the invention as claimed.

I claim:

1. A method of applying solder to a flexible circuit panel, comprising the steps of:
   lowering the panel into a solder bath;
   lifting the panel out of the solder bath past at least one nozzle;
   directing a jet of hot air from said at least one nozzle towards the panel for removing excess solder from the panel, said at least one nozzle having a negative pressure region adjacent the jet;
   supporting the panel by a carrier including a fulcrum means pivoting the panel about the fulcrum means, thereby causing the panel to enter the negative pressure region, with its lower end free, and ensuring that during the lifting step said lower end of the panel enters the negative pressure region which acts to draw the panel towards the nozzle(s).

2. A method as claimed in claim 1, wherein said fulcrum means comprises a plurality of horizontally disposed studs (52) on the carrier.

3. A method as claimed in claims 1 or 2, wherein the carrier has a series of poppets (50) for attaching the top portion of the panel thereto.

4. An improved method of achieving uniform solder deposits on lands on a flexible circuit substrate, using immersion in a bath of molten solder comprising:
   constraining an edge of said substrate against a planar carrier during exit from said bath for enabling pivoting motion of a free end of said substrate;
   providing a projecting fulcrum on said planar carrier, along a line parallel to said substrate edge;
   continuously directing hot air from a nozzle at an impingement angle with said planar carrier of substantially 60–65 degrees; and
   so that said free end of said substrate is engaged by air currents, pivoting the substrate to a negative pressure region adjacent said nozzle, said air currents creating a balance between a high pressure—high velocity component and a negative pressure—low velocity component thereof.

5. The method of claim 4 wherein said continuously directing step includes:
   directing air heated to a temperature sufficient to avoid solder solidification from a nozzle opening disposed a minimal distance from said planar carrier for permitting clearance as said carrier passes during exit.

* * * * *